(12) United States Patent
Camacho et al.

(10) Patent No.: US 8,241,956 B2
(45) Date of Patent: Aug. 14, 2012

(54) SEMICONDUCTOR DEVICE AND METHOD OF FORMING WAFER LEVEL MULTI-ROW ETCHED LEAD PACKAGE

(75) Inventors: Zigmund R. Camacho, Singapore (SG); Henry D. Bathan, Singapore (SG); Dioscoro A. Merilo, Singapore (SG); Emmanuel A. Espiritu, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 277 days.

(21) Appl. No.: 12/719,476

(22) Filed: Mar. 8, 2010

(65) Prior Publication Data

US 2011/0215449 A1 Sep. 8, 2011

(51) Int. Cl.
*H01L 21/00* (2006.01)
(52) U.S. Cl. ............... 438/109; 257/676; 257/E21.502
(58) Field of Classification Search ............ 438/109, 438/107; 257/676, 686
See application file for complete search history.

(56) References Cited

U.S. PATENT DOCUMENTS

| | | | |
|---|---|---|---|
| 6,774,499 B1 | 8/2004 | Yang | |
| 7,049,177 B1 | 5/2006 | Fan et al. | |
| 2007/0069376 A1 | 3/2007 | Dangelmaier et al. | |
| 2008/0169548 A1* | 7/2008 | Baek ........................... | 257/686 |
| 2009/0224402 A1 | 9/2009 | Do et al. | |
| 2009/0289356 A1 | 11/2009 | Camacho et al. | |
| 2010/0044850 A1* | 2/2010 | Lin et al. ...................... | 257/690 |

* cited by examiner

*Primary Examiner* — Phat X Cao
*Assistant Examiner* — Nga Doan
(74) *Attorney, Agent, or Firm* — Robert D. Atkins; Patent Law Group: Atkins & Associates, P.C.

(57) ABSTRACT

A semiconductor device has a base carrier having first and second opposing surfaces. The first surface of the base carrier is etched to form a plurality of cavities and multiple rows of base leads between the cavities extending between the first and second surfaces. A second conductive layer is formed over the second surface of the base carrier. A semiconductor die is mounted within a cavity of the base carrier. A first insulating layer is formed over the die and first surface of the base carrier and into the cavities. A first conductive layer is formed over the first insulating layer and first surface of the base carrier. A second insulating layer is formed over the first insulating layer and first conductive layer. A portion of the second surface of the base carrier is removed to expose the first insulating layer and electrically isolate the base leads.

20 Claims, 10 Drawing Sheets

SEMICONDUCTOR DEVICE AND METHOD OF FORMING WAFER LEVEL MULTI-ROW ETCHED LEAD PACKAGE

FIELD OF THE INVENTION

The present invention relates in general to semiconductor devices and, more particularly, to a semiconductor device and method of forming wafer-level multi-row etched lead package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Semiconductor devices are often stacked for efficient integration. The electrical interconnection between semiconductor devices, such as wafer level chip scale package (WLCSP) containing semiconductor die, on multiple levels (3-D device integration) and external devices can be accomplished with conductive through silicon vias (TSV), through hole vias (THV), Cu-plated conductive pillars, and conductive bumps. These vertical interconnect structures are costly and time consuming during the manufacturing process, and susceptible to defects during formation.

SUMMARY OF THE INVENTION

A need exists to provide simple and cost-effective vertical interconnect structure for stackable semiconductor devices. Accordingly, in one embodiment, the present invention is a method of manufacturing a semiconductor device comprising the steps of providing a base carrier having first and second opposing surfaces, etching the first surface of the base carrier to form a plurality of cavities and base leads between the cavities extending between the first and second surfaces, mounting a first semiconductor die within a cavity of the base carrier, forming a first insulating layer over the first semiconductor die and first surface of the base carrier and into the cavities, removing a portion of the first insulating layer to expose the first surface of the base carrier, forming a first conductive layer over the first insulating layer and first surface of the base carrier, forming a second insulating layer over the first insulating layer and first conductive layer, and removing a portion of the second surface of the base carrier to expose the first insulating layer and electrically isolate the base leads.

In another embodiment, the present invention is a method of manufacturing a semiconductor device comprising the steps of providing a base carrier having first and second opposing surfaces, etching the first surface of the base carrier to form a plurality of cavities and base leads between the cavities extending between the first and second surfaces, mounting a first semiconductor die within a cavity of the base carrier, forming a first insulating layer over the first semiconductor die and first surface of the base carrier and into the cavities, forming a first conductive layer over the first insulating layer and first surface of the base carrier, and removing a portion of the second surface of the base carrier to expose the first insulating layer and electrically isolate the base leads.

In another embodiment, the present invention is a method of manufacturing a semiconductor device comprising the steps of providing a base carrier having first and second opposing surfaces, etching the first surface of the base carrier to form a plurality of cavities and base leads between the cavities extending between the first and second surfaces, forming a first insulating layer over the first surface of the base carrier and into the cavities, forming a first conductive layer over the first insulating layer and first surface of the base carrier, forming a second insulating layer over the first insulating layer and first conductive layer, and removing a portion of the second surface of the base carrier to expose the first insulating layer and electrically isolate the base leads.

In another embodiment, the present invention is a semiconductor device made by a process comprising the steps of etching a first surface of a base carrier to form a plurality of cavities and base leads, mounting a first semiconductor die within a cavity of the base carrier, forming a first insulating layer over the first semiconductor die and first surface of the base carrier and into the cavities, forming a first conductive layer over the first insulating layer and first surface of the base carrier, forming a second insulating layer over the first insulating layer and first conductive layer, and removing a portion of a second surface of the base carrier opposite the first surface to expose the first insulating layer and electrically isolate the base leads.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
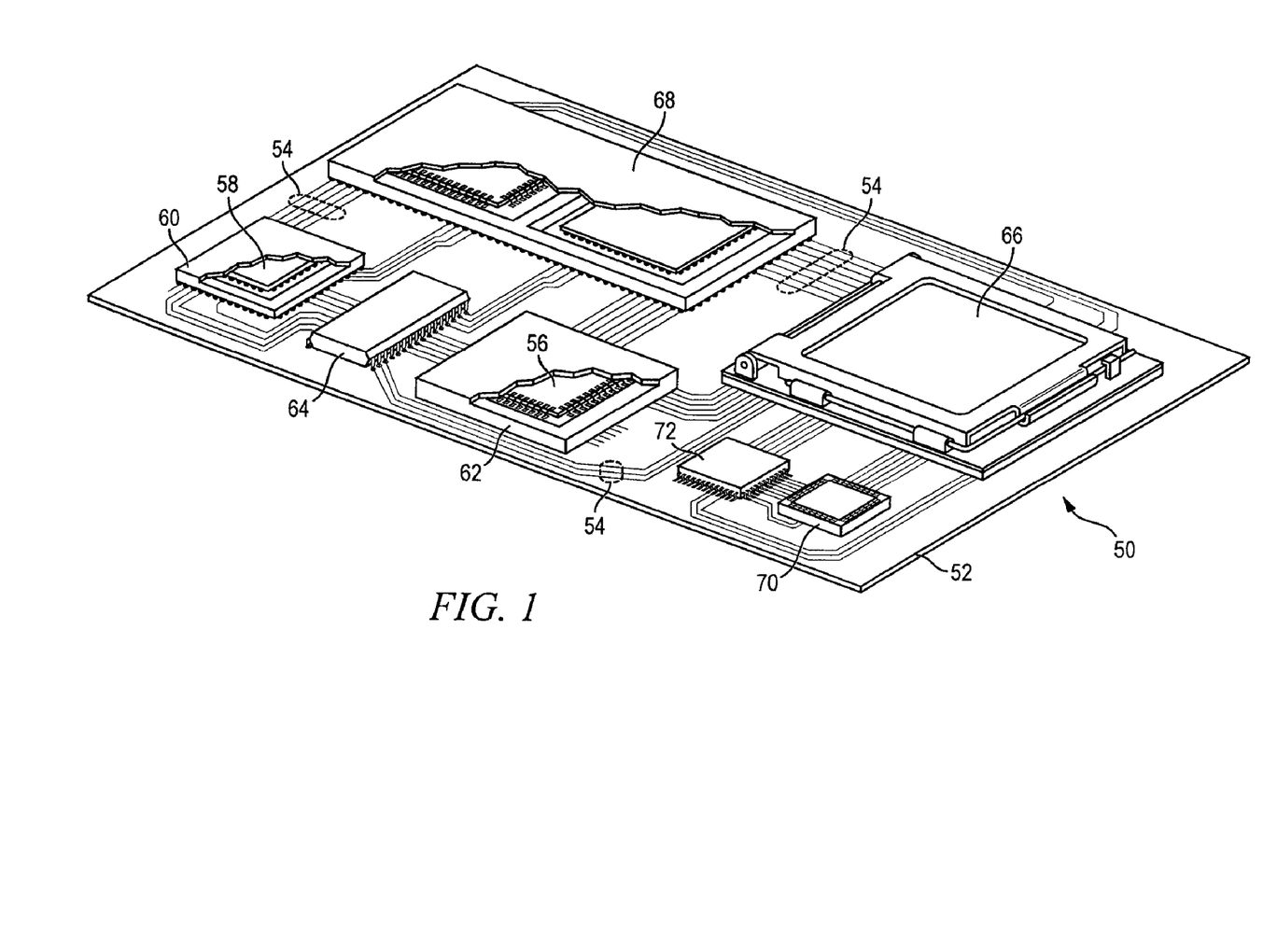
FIG. 1 illustrates a PCB with different types of packages mounted to its surface.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
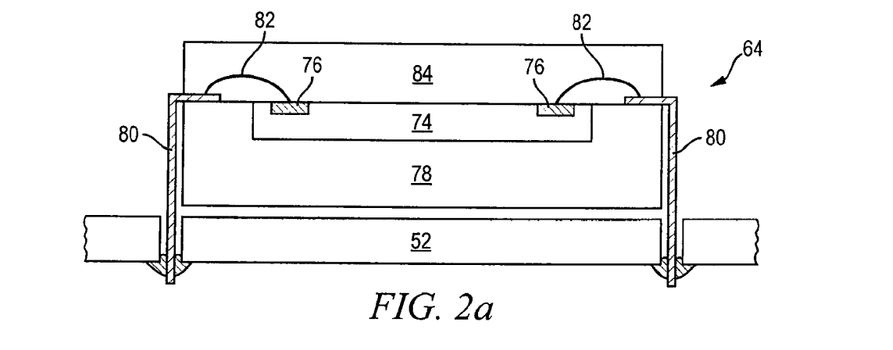
FIGS. 2a-2c illustrate further detail of the semiconductor packages mounted to the PCB.

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

Figure 2B:
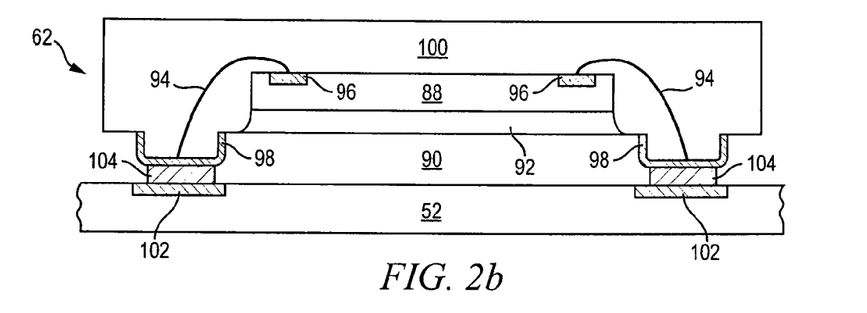

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 2C:
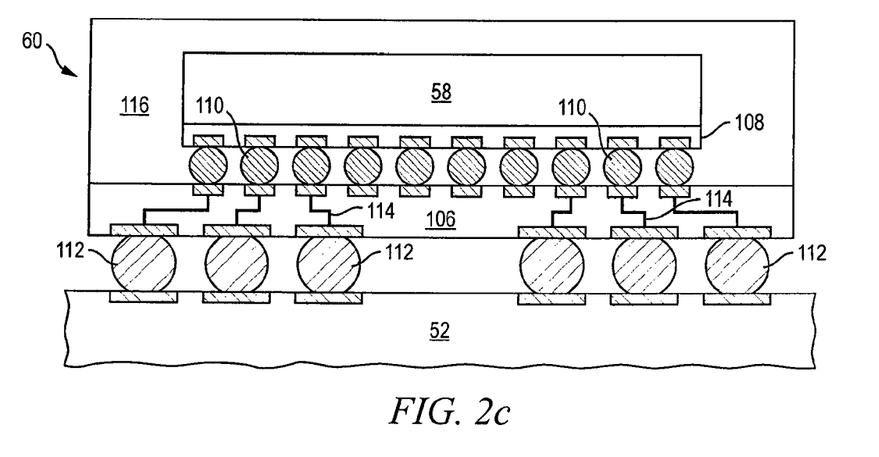

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
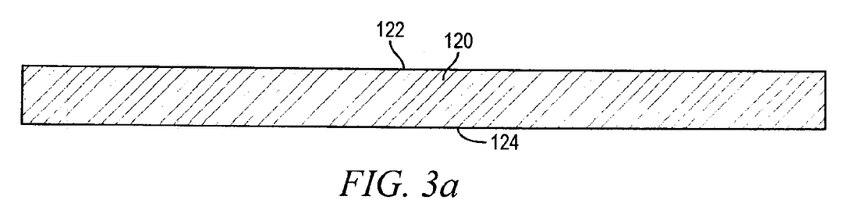
FIGS. 3a-3f illustrate a process of forming a wafer-level multi-row etched lead package with two passivation layers.
Figure 3B:
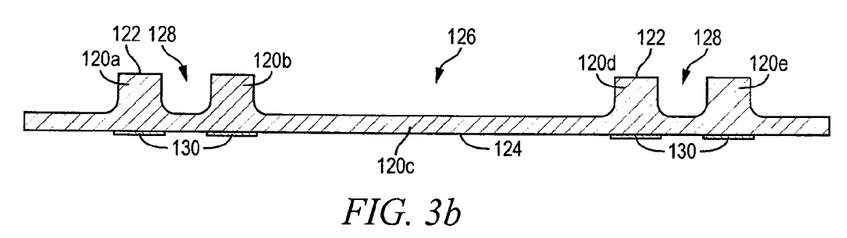

FIGS. 3a-3f illustrate, in relation to FIGS. 1 and 2a-2c, a process of forming a wafer-level multi-row etched lead package with two passivation layers. FIG. 3a shows a wafer-level base carrier or lead frame 120 made with Cu, Al, or other suitable conductive material. Base carrier 120 has surface 122 and opposite surface 124. Base carrier 120 is etched partially through surface 122 to form cavities 126 and 128 and multiple rows of base leads 120a, 120b, 120d, and 120e and remaining base carrier 120c, as shown in FIG. 3b. Base leads 102a, 120b, 120d, and 120e extend between surfaces 122 and 124 for standoff. The remaining base carrier 120c is thinner as it represents the bottom of cavities 126 and 128.

An electrically conductive layer 130 is formed on surface 124 of base carrier 120 below base leads 120a, 120b, 120d, and 120e using patterning and PVD, CVD, electrolytic plating, electroless plating process, or other suitable metal deposition process. In one embodiment, conductive layer 130 is nickel palladium (NiPd). Alternatively, conductive layer 130 can be one or more layers of Al, Cu, Sn, Ni, Au, Ag, or other suitable electrically conductive material.

Figure 3C:
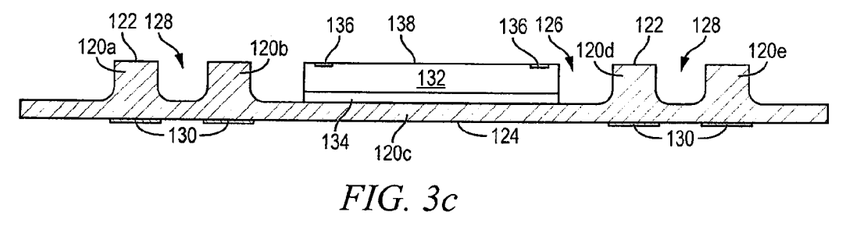

In FIG. 3c, semiconductor die or component 132 is mounted within cavity 126 to remaining base carrier 120c with die attach adhesive 134. Contact pads 136 on active surface 138 of semiconductor die 132 are oriented away from base carrier 120. Semiconductor die 132 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 138 to implement analog circuits or digital circuits, such as digital signal processor (DSP), ASIC, memory, or other signal processing circuit. Semiconductor die 132 may also contain IPDS, such as inductors, capacitors, and resistors, for RF signal processing. In another embodiment, a discrete semiconductor component can be mounted within cavity 126 to remaining base carrier 120c.

Figure 3D:
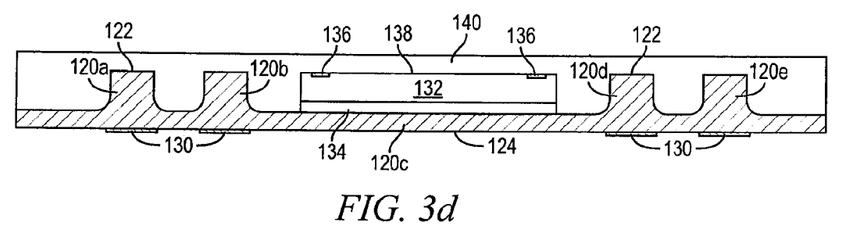

In FIG. 3d, an insulating or passivation layer 140 is formed over semiconductor die 132 and base carrier 120, including into cavities 126 and 128, by PVD, CVD, printing, spin coating, spray coating, or thermal oxidation. The insulating layer 140 can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 140 extends above surface 122 of base carrier 120.

In another embodiment, an encapsulant or molding compound is deposited over semiconductor die 132 and base carrier 120, including cavities 126 and 128, using a paste printing, compressive molding, transfer molding, liquid encapsulant molding, vacuum lamination, spin coating, or other suitable applicator. The encapsulant can be polymer composite material, such as epoxy resin with filler, epoxy acrylate with filler, or polymer with proper filler.

Figure 3E:
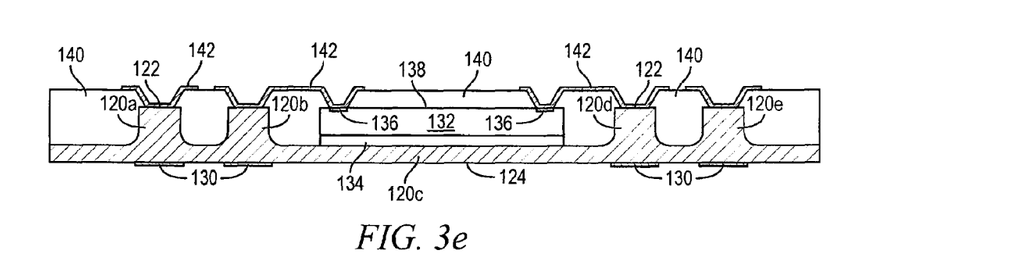

In FIG. 3e, a portion of insulating layer 140 is removed by an etching process to expose surface 122 of base carrier 120 and contact pads 136 of semiconductor die 132. An electrically conductive layer 142 is formed over insulating layer 140, surface 122, and contact pads 136 using patterning and PVD, CVD, electrolytic plating, electroless plating process, or other suitable metal deposition process. Conductive layer 142 can be one or more layers of Al, Cu, Sn, Ni, Au, Ag, or other suitable electrically conductive material. Conductive layer 142 is electrically connected to surface 122 of base carrier 120 and contact pads 136 of semiconductor die 132 and operates as a redistribution layer (RDL) to extend the electrical connectivity for semiconductor die 132 and base leads 120a, 120b, 120d, and 120e.

Figure 3F:
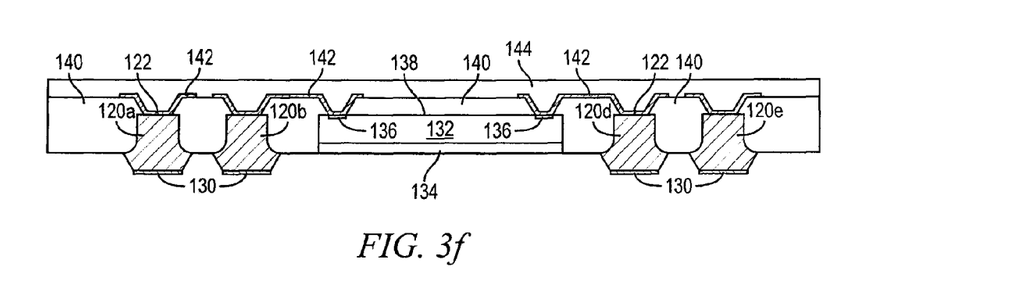

In FIG. 3f, an insulating or passivation layer 144 is formed over insulating layer 140 and conductive layer 142 by PVD, CVD, printing, spin coating, spray coating, or thermal oxidation. The insulating layer 144 can be one or more layers of SiO2, Si3N4, SiON, Ta2O5, Al2O3, or other material having similar insulating and structural properties. Base carrier 120c is removed by an etching process to expose semiconductor die 132 and insulating layer 140 and electrically isolate base leads 120a, 120b, 120d, and 120e into multiple rows defined by the post-etching areas of base carrier 120 that extend between surfaces 122 and 124. Base leads 120a, 120b, 120d, and 120e provide vertical electrical connection between conductive layer 130 and conductive layer 142.

The wafer-level structure shown in FIG. 3f is singulated into individual embedded wafer level ball grid array (eWLB), WLCSP, and quad flat pack no-load (QFN) semiconductor packages for further integration. The multiple rows of base leads 120a, 120b, 120d, and 120e of wafer-level base carrier 120 simplifies the vertical interconnection and integration of stacked semiconductor devices in a cost effective manner.

Figure 4:
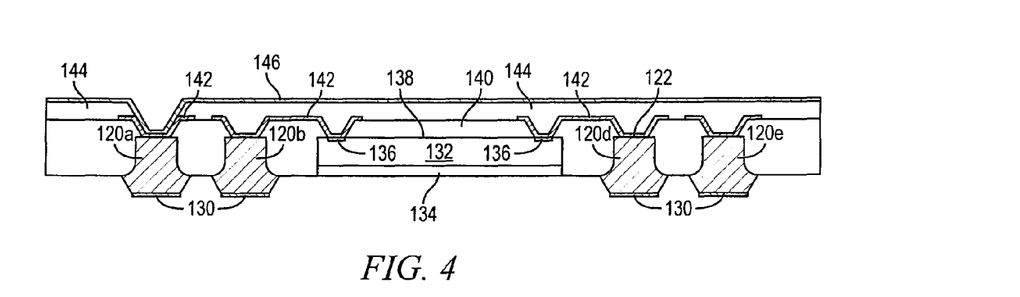
FIG. 4 illustrates the etched lead package with a shielding layer grounded to the vertical interconnect.

FIG. 4 shows an embodiment similar to FIG. 3 with a portion of insulating layer 144 over conductive layer 142 and base lead 120a is removed by an etching process to expose conductive layer 142. A shielding layer 146 is formed over insulating layer 144 and conductive layer 142. Shielding layer 146 can be Cu, Al, ferrite or carbonyl iron, stainless steel, nickel silver, low-carbon steel, silicon-iron steel, foil, epoxy, conductive resin, and other metals and composites capable of blocking or absorbing electromagnetic interference (EMI), radio frequency interference (RFI), and other inter-device interference. Shielding layer 146 can also be a non-metal material such as carbon-black or aluminum flake to reduce the effects of EMI and RFI. Shielding layer 146 is grounded through conductive layer 142, base lead 120a, and conductive layer 130.

Figure 5:
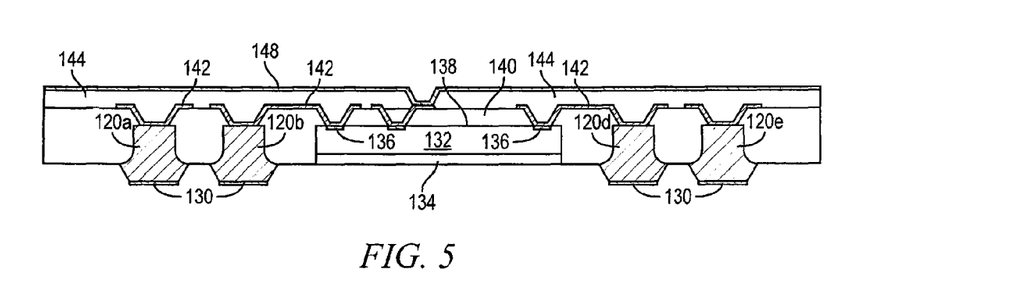
FIG. 5 illustrates the etched lead package with a shielding layer grounded to the semiconductor die.

FIG. 5 shows an embodiment similar to FIG. 3 with a portion of insulating layer 144 over conductive layer 142 and semiconductor die 132 removed by an etching process to expose conductive layer 142. Shielding layer 148 is formed over insulating layer 144 and conductive layer 142. Shielding layer 148 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 148 can also be a non-metal material such as carbon-black or aluminum flake to reduce the effects of EMI and RFI. Shielding layer 148 is grounded through conductive layer 142 and contact pad 136.

Figure 6A:
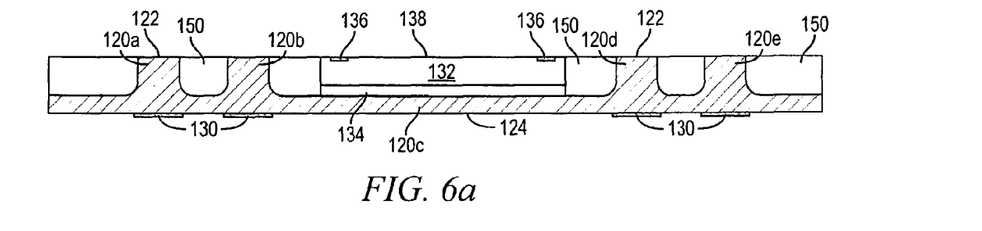
FIGS. 6a-6c illustrate a process of forming the wafer-level multi-row etched lead package with three passivation layers.

In another embodiment, continuing with the structure described up to FIG. 3c, an insulating or passivation layer 150 is formed over semiconductor die 132 and base carrier 120, including into cavities 126 and 128, by PVD, CVD, printing, spin coating, spray coating, or thermal oxidation, as shown in FIG. 6a. The insulating layer 150 can be one or more layers of SiO2, Si3N4, SiON, Ta2O5, Al2O3, or other material having similar insulating and structural properties. The insulating layer 150 is planarized with surface 122 of base carrier 120 and active surface 138 of semiconductor die 132. The insulating layer 150 is substantially coplanar with surface 122 of base carrier 120.

In another embodiment, an encapsulant or molding compound is deposited over semiconductor die 132 and base carrier 120, including cavities 126 and 128, using a paste printing, compressive molding, transfer molding, liquid encapsulant molding, vacuum lamination, spin coating, or other suitable applicator. The encapsulant can be polymer composite material, such as epoxy resin with filler, epoxy acrylate with filler, or polymer with proper filler.

Figure 6B:
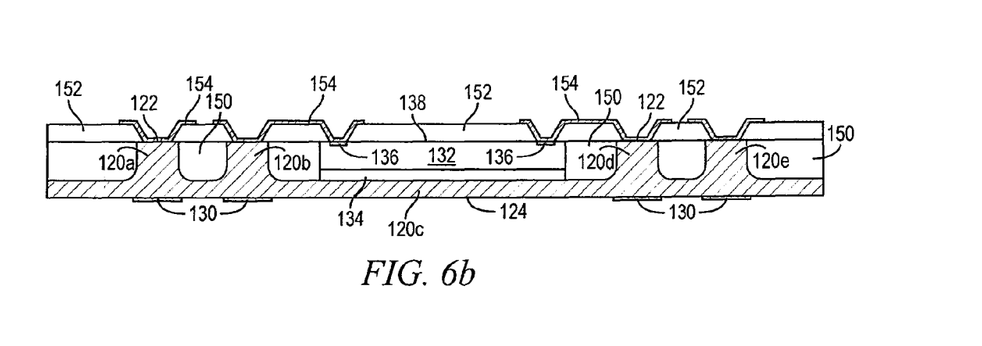

In FIG. 6b, an insulating or passivation layer 152 is formed over base carrier 120, semiconductor die 132, and insulating layer 150 by PVD, CVD, printing, spin coating, spray coating, or thermal oxidation. The insulating layer 152 can be one or more layers of SiO2, Si3N4, SiON, Ta2O5, Al2O3, or other material having similar insulating and structural properties. A portion of insulating layer 152 is removed by an etching process to expose surface 122 of base carrier 120 and contact pads 136 of semiconductor die 132. An electrically conductive layer 154 is formed over insulating layer 152, surface 122, and contact pads 136 using patterning and PVD, CVD, electrolytic plating, electroless plating process, or other suitable metal deposition process. Conductive layer 154 can be one or more layers of Al, Cu, Sn, Ni, Au, Ag, or other suitable electrically conductive material. Conductive layer 154 is electrically connected to surface 122 of base carrier 120 and contact pads 136 of semiconductor die 132 and operates as an RDL to extend the electrical connectivity for semiconductor die 132 and base leads 120a, 120b, 120d, and 120e.

Figure 6C:
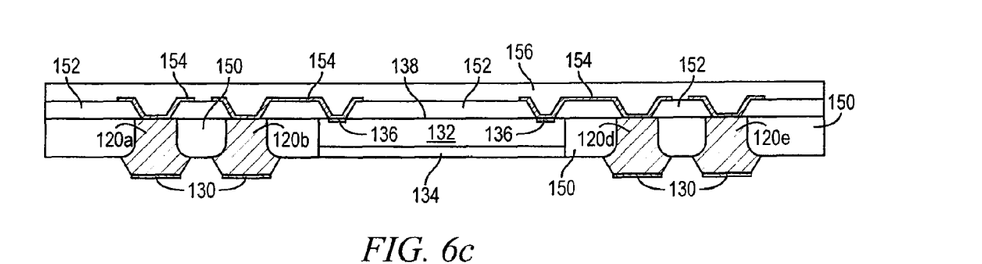

In FIG. 6c, an insulating or passivation layer 156 is formed over insulating layer 152 and conductive layer 154 by PVD, CVD, printing, spin coating, spray coating, or thermal oxidation. The insulating layer 156 can be one or more layers of SiO2, Si3N4, SiON, Ta2O5, Al2O3, or other material having similar insulating and structural properties. Base carrier 120c is removed by an etching process to expose semiconductor die 132 and insulating layer 150 and electrically isolate base leads 120a, 120b, 120d, and 120e into multiple rows defined by the post-etching areas of base carrier 120 that extend between surfaces 122 and 124. Base leads 120a, 120b, 120d, and 120e provide vertical electrical connection between conductive layer 130 and conductive layer 154.

Figure 7A:
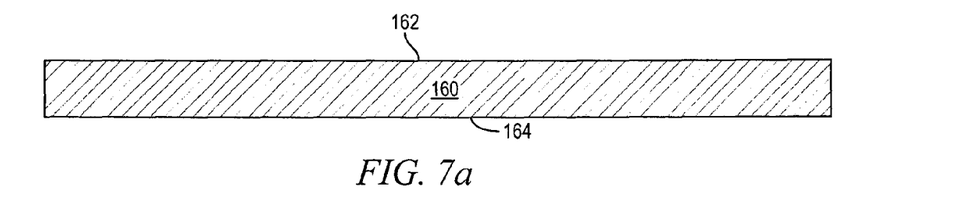
FIGS. 7a-7f illustrate a process of forming the wafer-level multi-row etched lead package with an additional electrical interconnect.
Figure 7B:
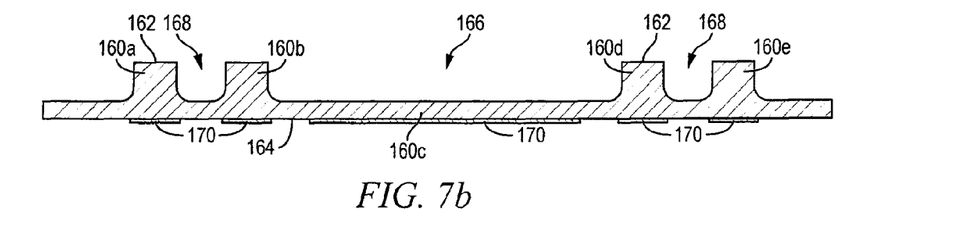

FIGS. 7a-7f illustrate, in relation to FIGS. 1 and 2a-2c, another process of forming a wafer-level multi-row etched lead package with two passivation layers. FIG. 7a shows a wafer-level base carrier or lead frame 160 made with Cu, Al, or other suitable conductive material. Base carrier 160 has surface 162 and opposite surface 164. Base carrier 160 is etched partially through surface 162 to form cavities 166 and 168 and multiple rows of base leads 160a, 160b, 160d, and 160e and remaining base carrier 160c, as shown in FIG. 7b. Base leads 160a, 160b, 160d, and 160e extend between surfaces 162 and 164 for standoff. The remaining base carrier 160c is thinner as it represents the bottom of cavities 166 and 168.

An electrically conductive layer 170 is formed on surface 164 of base carrier 160 below base leads 160a, 160b, 160d, and 160e and remaining base carrier 160c using patterning and PVD, CVD, electrolytic plating, electroless plating process, or other suitable metal deposition process. In one embodiment, conductive layer 170 is NiPd. Alternatively, conductive layer 170 can be one or more layers of Al, Cu, Sn, Ni, Au, Ag, or other suitable electrically conductive material.

Figure 7C:
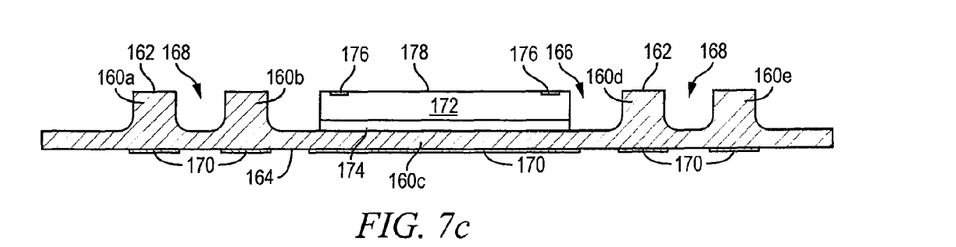

In FIG. 7c, semiconductor die or component 172 is mounted within cavity 166 to remaining base carrier 160c with die attach adhesive 174. Contact pads 176 on active surface 178 of semiconductor die 172 are oriented away from base carrier 160. Semiconductor die 172 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 178 to implement analog circuits or digital circuits, such as DSP, ASIC, memory, or other signal processing circuit. Semiconductor die 172 may also contain IPDS, such as inductors, capacitors, and resistors, for RF signal processing. In another embodiment, a discrete semiconductor component can be mounted within cavity 166 to remaining base carrier 160c.

Figure 7D:
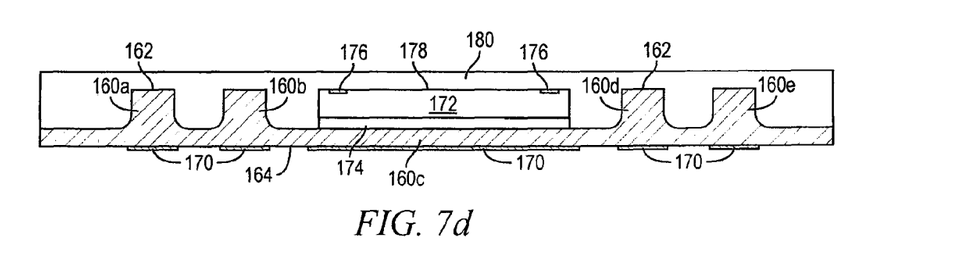

In FIG. 7d, an insulating or passivation layer 180 is formed over semiconductor die 172 and base carrier 160, including into cavities 166 and 168, by PVD, CVD, printing, spin coating, spray coating, or thermal oxidation. The insulating layer 180 can be one or more layers of SiO2, Si3N4, SiON, Ta2O, Al2O3, or other material having similar insulating and structural properties. The insulating layer 180 extends above surface 162 of base carrier 160.

In another embodiment, an encapsulant or molding compound is deposited over semiconductor die 172 and base carrier 160, including cavities 166 and 168, using a paste printing, compressive molding, transfer molding, liquid encapsulant molding, vacuum lamination, spin coating, or other suitable applicator. The encapsulant can be polymer composite material, such as epoxy resin with filler, epoxy acrylate with filler, or polymer with proper filler.

Figure 7E:
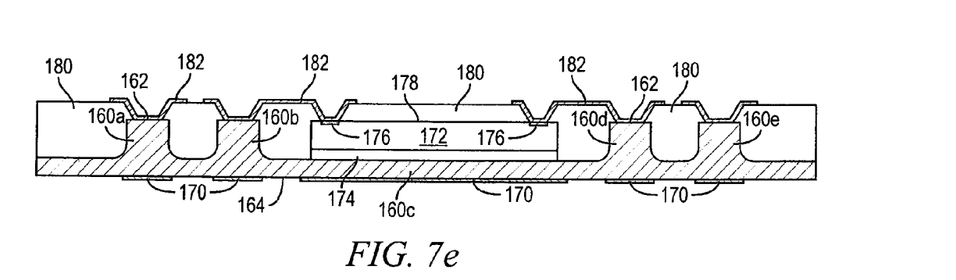

In FIG. 7e, a portion of insulating layer 180 is removed by an etching process to expose surface 162 of base carrier 160 and contact pads 176 of semiconductor die 172. An electrically conductive layer 182 is formed over insulating layer 180, surface 162, and contact pads 176 using patterning and PVD, CVD, electrolytic plating, electroless plating process, or other suitable metal deposition process. Conductive layer 182 can be one or more layers of Al, Cu, Sn, Ni, Au, Ag, or other suitable electrically conductive material. Conductive layer 182 is electrically connected to surface 162 of base carrier 160 and contact pads 176 of semiconductor die 172 and operates as an RDL to extend the electrical connectivity for semiconductor die 172 and base leads 160a, 160b, 160d, and 160e.

Figure 7F:
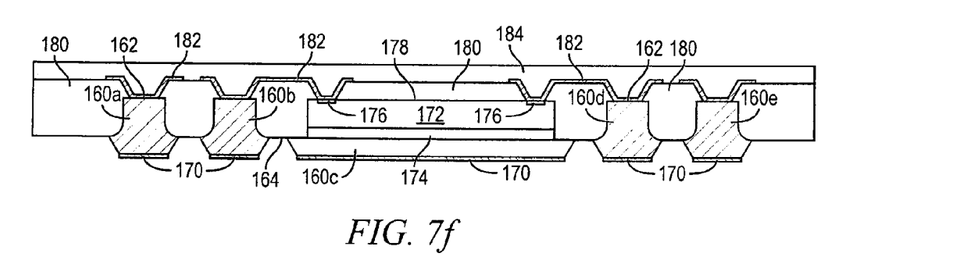

In FIG. 7f, an insulating or passivation layer 184 is formed over insulating layer 180 and conductive layer 182 by PVD, CVD, printing, spin coating, spray coating, or thermal oxidation. The insulating layer 184 can be one or more layers of SiO2, Si3N4, SiON, Ta2O5, Al2O3, or other material having similar insulating and structural properties. A portion of base carrier 160c is removed by an etching process to expose insulating layer 180 and electrically isolate base leads 160a, 160b, 160d, and 160e into multiple rows defined by the post-etching areas of base carrier 160 that extend between surfaces 162 and 164. Base leads 160a, 160b, 160d, and 160e provide vertical electrical connection between conductive layer 170 and conductive layer 182. The remaining portion of base carrier 160c and associated conductive layer 170 not removed by the etching process provide additional electrical interconnect.

The wafer-level structure shown in FIG. 7f is singulated into individual eWLB, WLCSP, and QFN semiconductor packages for further integration. The multiple rows of base leads 160a, 160b, 160d, and 160e of wafer-level base carrier 160 simplifies the vertical interconnection and integration of stacked semiconductor devices in a cost effective manner.

Figure 8A:
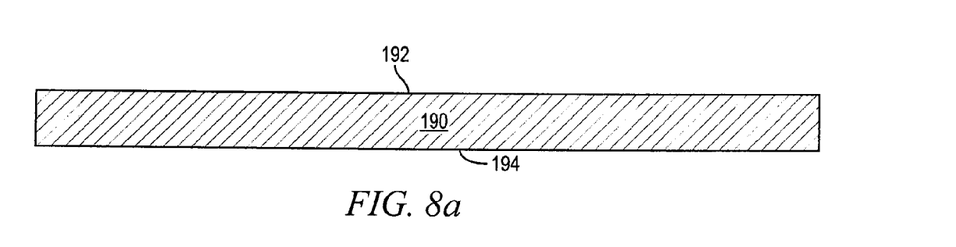
FIGS. 8a-8g illustrate a process of forming the multi-row etched lead package with UBM formed over the RDL.
Figure 8B:
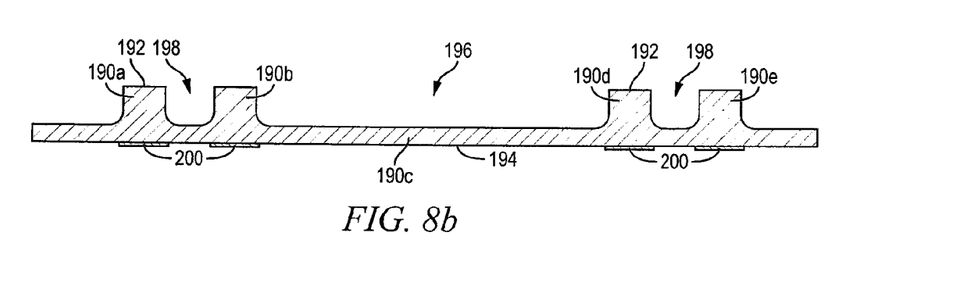

FIGS. 8a-8f illustrate another process of forming a wafer-level multi-row etched lead package with two passivation layers. FIG. 8a shows a wafer-level base carrier or lead frame 190 made with Cu, Al, or other suitable conductive material. Base carrier 190 has surface 192 and opposite surface 194. Base carrier 190 is etched partially through surface 192 to form cavities 196 and 198 and multiple rows of base leads 190a, 190b, 190d, and 190e and remaining base carrier 190c, as shown in FIG. 8b. Base leads 190a, 190b, 190d, and 190e extend between surfaces 192 and 194 for standoff. The remaining base carrier 190c is thinner as it represents the bottom of cavities 196 and 198.

An electrically conductive layer 200 is formed on surface 194 of base carrier 190 below base leads 190a, 190b, 190d, and 190e using patterning and PVD, CVD, electrolytic plating, electroless plating process, or other suitable metal deposition process. In one embodiment, conductive layer 200 is NiPd. Alternatively, conductive layer 200 can be one or more layers of Al, Cu, Sn, Ni, Au, Ag, or other suitable electrically conductive material.

Figure 8C:
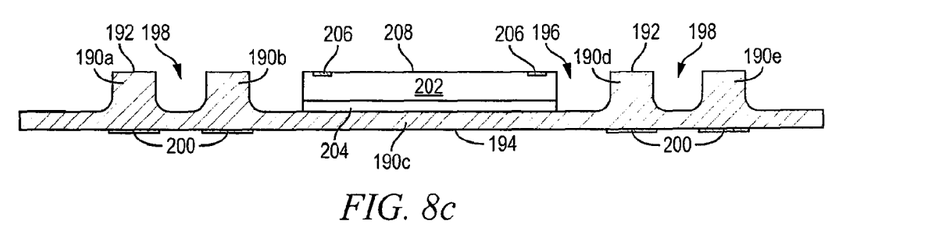

In FIG. 8c, semiconductor die or component 202 is mounted within cavity 196 to remaining base carrier 190c with die attach adhesive 204. Contact pads 206 on active surface 208 of semiconductor die 202 are oriented away from base carrier 190. Semiconductor die 202 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 208 to implement analog circuits or digital circuits, such as DSP, ASIC, memory, or other signal processing circuit. Semiconductor die 202 may also contain IPDS, such as inductors, capacitors, and resistors, for RF signal processing. In another embodiment, a discrete semiconductor component can be mounted within cavity 196 to remaining base carrier 190c.

Figure 8D:
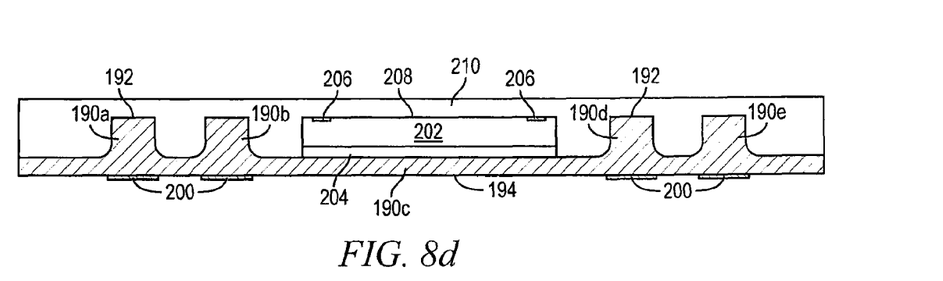

In FIG. 8d, an insulating or passivation layer 210 is formed over semiconductor die 202 and base carrier 190, including cavities 196 and 198, by PVD, CVD, printing, spin coating, spray coating, or thermal oxidation. The insulating layer 210 can be one or more layers of SiO2, Si3N4, SiON, Ta2O, Al2O3, or other material having similar insulating and structural properties. The insulating layer 210 extends above surface 192 of base carrier 190.

In another embodiment, an encapsulant or molding compound is deposited over semiconductor die 202 and base carrier 190, including cavities 196 and 198, using a paste printing, compressive molding, transfer molding, liquid encapsulant molding, vacuum lamination, spin coating, or other suitable applicator. The encapsulant can be polymer composite material, such as epoxy resin with filler, epoxy acrylate with filler, or polymer with proper filler.

Figure 8E:
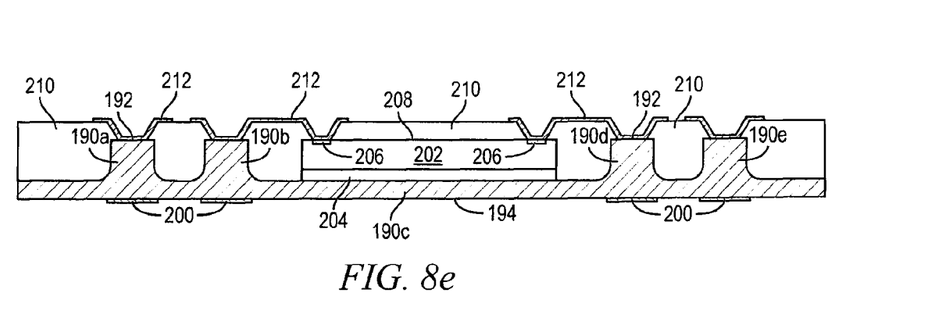

In FIG. 8e, a portion of insulating layer 210 is removed by an etching process to expose surface 192 of base carrier 190 and contact pads 206 of semiconductor die 202. An electrically conductive layer 212 is formed over insulating layer 210, surface 192, and contact pads 206 using patterning and PVD, CVD, electrolytic plating, electroless plating process, or other suitable metal deposition process. Conductive layer 212 can be one or more layers of Al, Cu, Sn, Ni, Au, Ag, or other suitable electrically conductive material. Conductive layer 212 is electrically connected to surface 192 of base carrier 190 and contact pads 206 of semiconductor die 202 and operates as an RDL to extend the electrical connectivity for semiconductor die 202 and base leads 190a, 190b, 190d, and 190e.

Figure 8F:
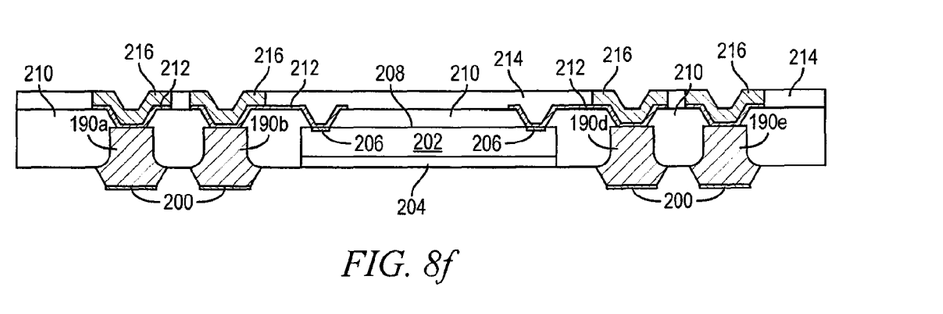

In FIG. 8f, an insulating or passivation layer 214 is formed over insulating layer 210 and conductive layer 212 by PVD, CVD, printing, spin coating, spray coating, or thermal oxidation. The insulating layer 214 can be one or more layers of SiO2, Si3N4, SiON, Ta2O5, Al2O3, or other material having similar insulating and structural properties. A portion of insulating layer 214 is removed by an etching process to expose conductive layer 212.

An electrically conductive layer 216 is formed over conductive layer 212 using patterning and PVD, CVD, electrolytic plating, electroless plating process, or other suitable metal deposition process. Conductive layer 216 can be one or more layers of Al, Cu, Sn, Ni, Au, Ag, or other suitable electrically conductive material. Conductive layer 216 forms a multi-layer under bump metallization (UBM) including a barrier layer and adhesion layer. In one embodiment, the barrier layer contains Ni, titanium tungsten (TiW), chromium copper (CrCu), nickel vanadium (NiV), platinum (Pt), or palladium (Pd). The adhesion layer contains Al, titanium (Ti), chromium (Cr), or titanium nitride (TiN). UBM 216 provides a low resistive interconnect, as well as a barrier to Cu or solder diffusion.

Base carrier 190c is removed by an etching process to expose insulating layer 210 and electrically isolate base leads 190a, 190b, 190d, and 190e into multiple rows defined by the post-etching areas of base carrier 190 that extend between surfaces 192 and 194. Base leads 190a, 190b, 190d, and 190e provide vertical electrical connection between conductive layer 200 and conductive layer 212 and UBM 216.

Figure 8G:
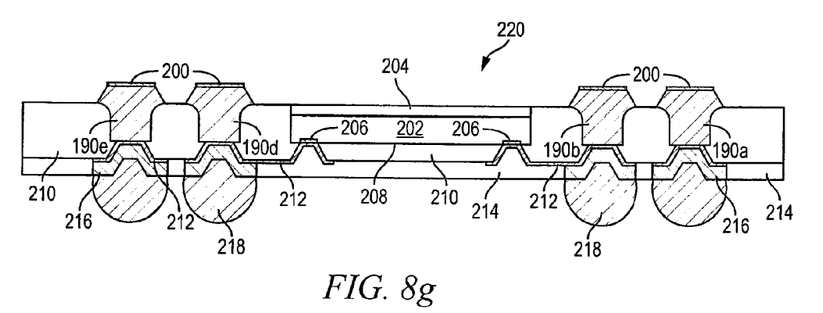

In FIG. 8g, an electrically conductive bump material is deposited over UBM 216 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 216 using a suitable attachment or bonding process. In one embodiment, the bump material is reflowed by heating the material above its melting point to form spherical balls or bumps 218. In some applications, bumps 218 are reflowed a second time to improve electrical contact to UBM 216. The bumps can also be compression bonded to UBM 216. Bumps 218 represent one type of interconnect structure that can be formed over UBM 216. The interconnect structure can also use bond wires, conductive paste, stud bump, micro bump, or other electrical interconnect.

The wafer-level structure shown in FIG. 8g is singulated into individual eWLB, WLCSP, and QFN semiconductor devices 220 for further integration. The multiple rows of base leads 190a, 190b, 190d, and 190e of wafer-level base carrier 190 simplifies the vertical interconnection and integration of stacked semiconductor devices in a cost effective manner.

Figure 9:
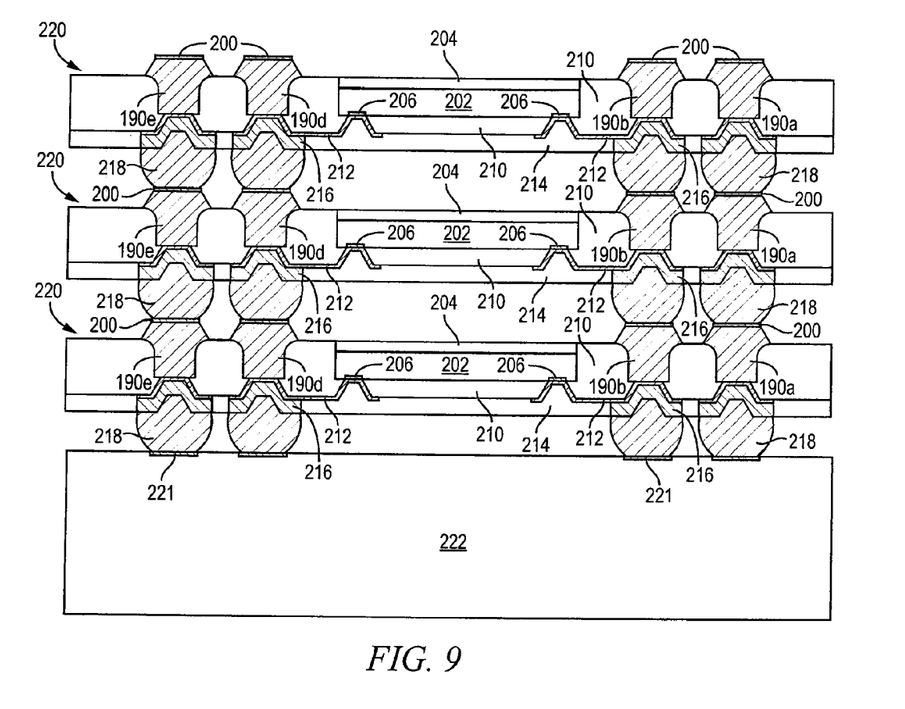
FIG. 9 illustrates stacked semiconductor devices interconnected by multiple rows of base leads and bumps.

Semiconductor devices 220 are stackable as shown in FIG. 9. Each semiconductor device 220 is electrically connected to upper and lower devices through conductive layers 200 and 212, UBM 216, bumps 218, and base leads 190a, 190b, 190d, and 190e. The stacked semiconductor devices 220 are mounted to conductive traces 221 on printed circuit board 222.

Figure 10:
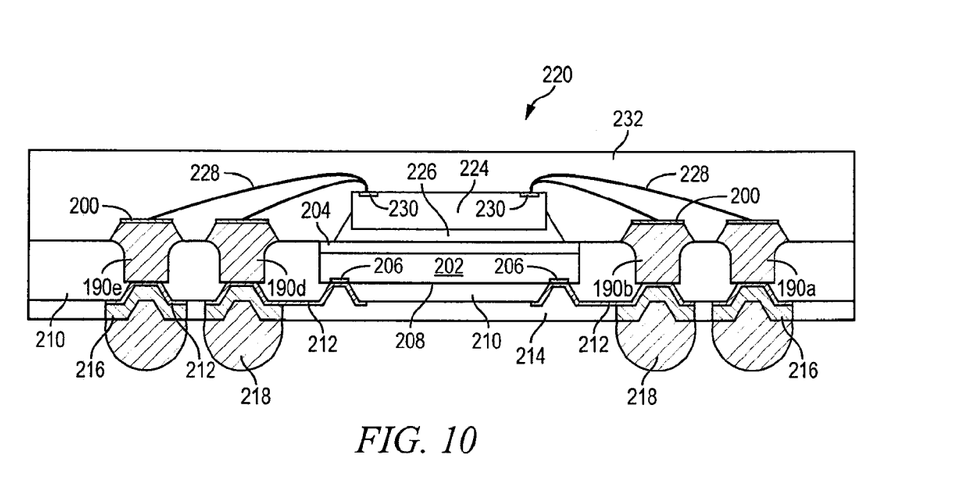
FIG. 10 illustrates a second semiconductor die attached to the first semiconductor die with adhesive and interconnected to the base leads by bond wires.

FIG. 10 shows semiconductor die 224 mounted to semiconductor die 202 with die attach adhesive 226. Semiconductor die 224 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 224 may also contain IPDS, such as inductors, capacitors, and resistors, for RF signal processing. In another embodiment, a discrete semiconductor component can be mounted to semiconductor die 202. Bond wires 228 are formed between contact pads 230 on semiconductor die 224 and conductive layer 200.

An encapsulant or molding compound 232 is deposited over semiconductor device 220 and semiconductor die 224 using a paste printing, compressive molding, transfer molding, liquid encapsulant molding, vacuum lamination, spin coating, or other suitable applicator. Encapsulant 232 can be polymer composite material, such as epoxy resin with filler, epoxy acrylate with filler, or polymer with proper filler. Encapsulant 232 is non-conductive and environmentally protects the semiconductor device from external elements and contaminants.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
   providing a base carrier having first and second opposing surfaces;
   etching the first surface of the base carrier to form a plurality of cavities and base leads between the cavities extending between the first and second surfaces;
   mounting a first semiconductor die within a cavity of the base carrier;
   forming a first insulating layer over the first semiconductor die and first surface of the base carrier and into the cavities;
   removing a portion of the first insulating layer to expose the first surface of the base carrier;
   forming a first conductive layer over the first insulating layer and first surface of the base carrier;
   forming a second insulating layer over the first insulating layer and first conductive layer; and
   removing a portion of the second surface of the base carrier to expose the first insulating layer and electrically isolate the base leads.

2. The method of claim 1, further including forming a second conductive layer over the second surface of the base carrier adjacent to the base leads.

3. The method of claim 1, further including:
   removing a portion of the second insulating layer to expose the first conductive layer; and
   forming a shielding layer over the second insulating layer and first conductive layer.

4. The method of claim 1, further including:
   mounting a second semiconductor die to the first semiconductor die;
   electrically connecting the second semiconductor die and base leads; and
   depositing an encapsulant over the first and second semiconductor die and base carrier.

5. The method of claim 1, further including:
   forming a second conductive layer over the first conductive layer; and
   forming a bump over the second conductive layer.

6. The method of claim 1, further including:
   forming a bump over the first conductive layer;
   stacking a plurality of the semiconductor devices; and
   electrically connecting the stacked semiconductor devices through the first conductive layer, base leads, and bump.

7. A method of manufacturing a semiconductor device, comprising:
   providing a base carrier having first and second opposing surfaces;
   etching the first surface of the base carrier to form a plurality of cavities and base leads between the cavities extending between the first and second surfaces;
   mounting a first semiconductor die within a cavity of the base carrier;
   forming a first insulating layer over the first semiconductor die and first surface of the base carrier and into the cavities;
   forming a first conductive layer over the first insulating layer and first surface of the base carrier; and
   removing a portion of the second surface of the base carrier to expose the first insulating layer and electrically isolate the base leads.

8. The method of claim 7, further including:
   forming a second insulating layer over the first insulating layer;
   removing a portion of the second insulating layer to expose the first surface of the base carrier;
   forming the first conductive layer over the second insulating layer and first surface of the base carrier; and
   forming a third insulating layer over the second insulating layer and first conductive layer.

9. The method of claim 7, further including forming a second conductive layer over the second surface of the base carrier adjacent to the base leads.

10. The method of claim 9, wherein removing the portion of the second surface of the base carrier leaves a portion of the second conductive layer under the first semiconductor die.

11. The method of claim 7, further including:
    mounting a second semiconductor die to the first semiconductor die;
    electrically connecting the second semiconductor die and base leads; and
    depositing an encapsulant over the first and second semiconductor die and base carrier.

12. The method of claim 7, further including:
    forming a second conductive layer over the first conductive layer; and
    forming a bump over the second conductive layer.

13. The method of claim 7, further including:
    forming a bump over the first conductive layer;
    stacking a plurality of the semiconductor devices; and
    electrically connecting the stacked semiconductor devices through the first conductive layer, base leads, and bump.

14. A method of manufacturing a semiconductor device, comprising:
    providing a base carrier having first and second opposing surfaces;
    etching the first surface of the base carrier to form a plurality of cavities and base leads between the cavities extending between the first and second surfaces;
    forming a first insulating layer over the first surface of the base carrier and into the cavities;
    forming a first conductive layer over the first insulating layer and first surface of the base carrier;
    forming a second insulating layer over the first insulating layer and first conductive layer; and
    removing a portion of the second surface of the base carrier to expose the first insulating layer and electrically isolate the base leads.

15. The method of claim 14, further including mounting a first semiconductor die within a cavity of the base carrier prior to forming the first insulating layer.

16. The method of claim 15, further including:
    mounting a second semiconductor die to the first semiconductor die;
    electrically connecting the second semiconductor die and base leads; and depositing an encapsulant over the first and second semiconductor die and base carrier.

17. The method of claim 14, further including forming a second conductive layer over the second surface of the base carrier adjacent to the base leads.

18. The method of claim 14, further including:
removing a portion of the second insulating layer to expose the first conductive layer; and
forming a shielding layer over the second insulating layer and first conductive layer.

19. The method of claim 14, further including:
forming a second conductive layer over the first conductive layer; and
forming a bump over the second conductive layer.

20. The method of claim 14, further including:
forming a bump over the first conductive layer;
stacking a plurality of the semiconductor devices; and
electrically connecting the stacked semiconductor devices through the first conductive layer, base leads, and bump.

* * * * *